US006653912B2

(12) United States Patent
Robinson et al.

(10) Patent No.: US 6,653,912 B2
(45) **Date of Patent: *Nov. 25, 2003**

(54) RF AND MICROWAVE DUPLEXERS THAT OPERATE IN ACCORDANCE WITH A CHANNEL FREQUENCY ALLOCATION METHOD

(75) Inventors: John Robinson, Mt. Airy, MD (US); Xiao-Peng Liang, San Jose, CA (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/268,198

(22) Filed: Oct. 10, 2002

(65) Prior Publication Data

US 2003/0048153 A1 Mar. 13, 2003

Related U.S. Application Data

(63) Continuation of application No. 10/000,490, filed on Nov. 2, 2001, now Pat. No. 6,492,883.

(60) Provisional application No. 60/245,538, filed on Nov. 3, 2000.

(51) Int. Cl.[7] .......... H01P 1/213; H03H 7/46

(52) U.S. Cl. .......... 333/132; 333/134; 333/174; 333/205

(58) Field of Search .......... 333/126, 129, 333/132, 134, 174, 202, 205, 207, 209; 455/87, 82, 78

(56) References Cited

U.S. PATENT DOCUMENTS 4,186,359 A * 1/1980 Kaegebein .......... 333/134
4,980,660 A 12/1990 Nakamura et al.
5,023,935 A 6/1991 Vancraeynest
5,227,748 A 7/1993 Sroka (List continued on next page.)

FOREIGN PATENT DOCUMENTS

| | | |
|---|---|---|
| EP | 0 932 171 A2 | 6/1999 |
| JP | 60223304 | 11/1975 |
| WO | WO 00/35042 A1 | 6/2000 |

OTHER PUBLICATIONS

PCT International Search Report for International Application No. PCT/US01/45560 dated Oct. 9, 2002.

Kozyrev et al., "Ferroelectric Films: Nonlinear Properties and Applications in Microwave Devices," *IEEE*, 1998, pp. 985–988.

U.S. patent application Ser. No. 09/594,837, Chiu et al., filed Jun. 15, 2000.

U.S. patent application Ser. No. 09/704,850, Zhu et al., filed Nov. 2, 2000.

U.S. patent application Ser. No. 09/768,690, Sengupta et al., filed Jan. 24, 2001.

U.S. patent application Ser. No. 09/834,327, Chang, filed Apr. 13, 2001.

U.S. patent application Ser. No. 09/882,605, Sengupta, filed Jun. 15, 2001.

U.S. patent application Ser. No. 60/295,046, Luna et al., filed Jun. 1, 2001.

*Primary Examiner*—Seungsook Ham

(74) *Attorney, Agent, or Firm*—Robert P. Lenart; William J. Tucker; James S. Finn

(57) ABSTRACT

A duplexer is provided that includes a first tunable bandpass filter, a second tunable bandpass filter and means for coupling the first bandpass filter and the second bandpass filter to an antenna. The duplexer is operated by tuning the first tunable bandpass filter to provide a passband corresponding to an assigned transmit frequency, and tuning the second tunable bandpass filter to provide a passband offset from an assigned receive frequency, when the duplexer is operated in a transmit mode. When the duplexer is operated in a receive mode, the first tunable bandpass filter is tuned to provide a passband offset from an assigned transmit frequency and the second tunable bandpass filter is tuned to provide a passband corresponding to the assigned receive frequency.

11 Claims, 3 Drawing Sheets

U.S. PATENT DOCUMENTS

| | | | | |
|---|---|---|---|---|
| 5,374,906 | A | | 12/1994 | Noguchi et al. |
| 5,387,886 | A | | 2/1995 | Takalo et al. |
| 5,427,988 | A | | 6/1995 | Sengupta et al. |
| 5,515,017 | A | | 5/1996 | Yamada et al. |
| 5,534,829 | A | | 7/1996 | Kobayashi et al. |
| 5,613,234 | A | | 3/1997 | Vella-Coleiro |
| 5,627,502 | A | | 5/1997 | Ervasti |
| 5,635,433 | A | | 6/1997 | Sengupta |
| 5,635,434 | A | | 6/1997 | Sengupta |
| 5,640,042 | A | | 6/1997 | Koscica et al. ............. 257/595 |
| 5,693,429 | A | | 12/1997 | Sengupta et al. |
| 5,717,368 | A | | 2/1998 | Niiranen |
| 5,766,697 | A | | 6/1998 | Sengupta et al. |
| 5,815,048 | A | | 9/1998 | Ala-Kojola et al. |
| 5,815,804 | A | | 9/1998 | Newell et al. |
| 5,830,591 | A | | 11/1998 | Sengupta et al. |
| 5,846,893 | A | | 12/1998 | Sengupta et al. |
| 5,917,387 | A | | 6/1999 | Rice et al. |
| 5,923,647 | A | | 7/1999 | Dolman et al. ............. 370/280 |
| 5,963,856 | A | | 10/1999 | Kim |
| 5,986,520 | A | * | 11/1999 | Abeno et al. ............... 333/134 |
| 6,023,609 | A | * | 2/2000 | Futamura .................... 333/132 |
| 6,074,971 | A | | 6/2000 | Chiu et al. |
| 6,085,071 | A | | 7/2000 | Yamada et al. |
| 6,111,482 | A | | 8/2000 | Atokawa |
| 6,288,620 | B1 | | 9/2001 | Atokawa et al. |
| 6,307,448 | B1 | | 10/2001 | Atokawa et al. |
| 6,308,051 | B1 | | 10/2001 | Atokawa |
| 2001/0028284 | A1 | | 10/2001 | Yamashita et al. |

* cited by examiner

RF AND MICROWAVE DUPLEXERS THAT OPERATE IN ACCORDANCE WITH A CHANNEL FREQUENCY ALLOCATION METHOD

CROSS REFERENCE TO A RELATED APPLICATION

This application is a Continuation of prior application Ser. No. 10/000,490 filed on Nov. 2, 2001, now (U.S. Pat. No. 6,492,883), which claimed the benefit of U.S. Provisional Application Ser. No. 60/245,538, filed Nov. 3, 2000.

FIELD OF INVENTION

The present invention generally relates to electronic duplexers, and more particularly to a method of operating tunable duplexers.

BACKGROUND OF INVENTION

This invention relates to radio frequency and microwave duplexers used in wireless communications transceivers having two channel frequency allocations.

Wireless communications applications have increased to crowd the available spectrum and drive the need for high isolation between adjacent bands. Portability requirements of mobile communications additionally drive the need to reduce the size of communications equipment. Filter and duplexer products are some of the most inevitable components in the radio with requirements to provide improved performance using smaller sized components. Thus efforts have been made to develop new types of resonators, new coupling structures, and new configurations to address these requirements.

Many radio systems use a duplexer to couple the transmit and receive channels to a common shared antenna. Low insertion loss in the two channel passbands and high isolation between the two channels are usually the most important performance requirements of the duplexer. Filter design theory shows, however, that for a given filter frequency mask, optimization of the insertion loss performance often results in degradation of the isolation performance and visa versa. A trade-off between the two parameters is usually required.

Commercially available radio frequency (RF) duplexers include two fixed bandpass filters sharing a common port (antenna port) through a circulator or a T-junction. Signals applied to the antenna port are coupled to a receiver port through the receive bandpass filter, and signals applied to a transmitter port will reach the antenna port through a transmit filter. The receive port and transmitter port are isolated from each other due to the presence of the filters and the circulator, or T-junction. Fixed duplexers are commonly used in point-to-point and point-to-multipoint radios where two-way communication enables voice, video and data traffic within the RF frequency range. Fixed duplexers need to be wide band so that a reasonable number of duplexers can cover the desired frequency plan.

Tunable duplexers could be used to replace fixed duplexers in receivers. A single tunable duplexer could replace several fixed duplexers covering adjacent frequencies. Duplexers that include tunable or switchable filters have been described in U.S. Pat. Nos. 6,307,448; 6,288,620; 6,111,482; 6,085,071; and 5,963,856.

It would be desirable to operate a tunable duplexer in a manner that improves isolation between the transmit and receive channels.

SUMMARY OF THE INVENTION

This invention provides a duplexer including a first tunable bandpass filter, a second tunable bandpass filter and means for coupling the first bandpass filter and the second bandpass filter to an antenna. The duplexer is operated by tuning the first tunable bandpass filter to provide a passband corresponding to an assigned transmit frequency, and tuning the second tunable bandpass filter to provide a passband offset from an assigned receive frequency, when the duplexer is operated in a transmit mode. When the duplexer is operated in a receive mode, the first tunable bandpass filter is tuned to provide a passband offset from an assigned transmit frequency and the second tunable bandpass filter is tuned to provide a passband corresponding to the assigned receive frequency.

By using this technique, the isolation between transmit and receive portions of a communications device is improved. The invention also permits the use of filters having a larger passband while maintaining sufficient isolation.

DETAILED DESCRIPTION OF THE INVENTION

The present invention can be implemented using tunable duplexers having low insertion loss, fast tuning speed, high power-handling capability, high IP3 and low cost in the microwave frequency range.

Figure 1:
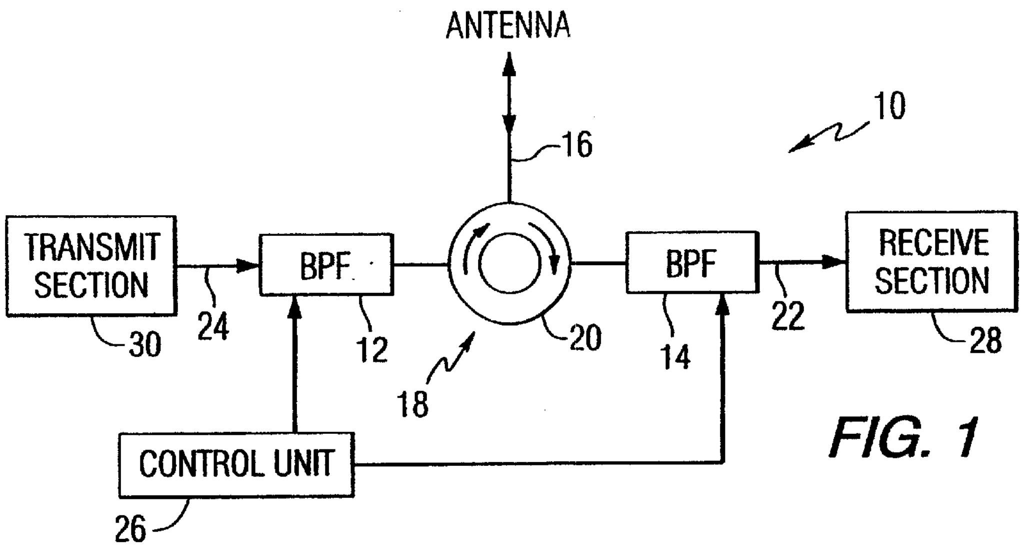
FIG. 1 is a schematic representation of a tunable duplexer that can operate in accordance with this invention.

Referring to the drawings, FIG. 1 is a schematic representation of a tunable duplexer 10 that can be operated in accordance with this invention. The tunable duplexer 10 includes two electronically tunable bandpass filters 12 and 14 connected to a common port 16 through a coupling means 18. In the particular duplexer of FIG. 1, the coupling means is a circulator 20. Filter 14 is a receive filter connected to couple signals from the coupling means to a first (receive) port 22. Filter 12 is a transmit filter connected to couple signals from the coupling means to a second (transmit) port 24. Filters 12 and 14 are tunable bandpass filters. The filters can include tunable dielectric varactors that can be rapidly tuned and are used to control the transmission characteristics of the filters. Alternatively, microelectromechanical (MEM) variable capacitors can be used in the tunable filters. A control unit 26, which can be a computer or other processor, is used to supply a control signal to tunable capacitors in the filters, preferably through high impedance control lines. The receive port 22 is connected to receive section 28 of a communication device, and the transmit port 24 is connected to transmit section 30 of the communication device. The control unit can use an open loop or closed loop control technique. Various types of tunable filters can be used in the duplexers of this invention. The circulator 20 of FIG. 1 provides isolation between the two filters.

Figure 2:
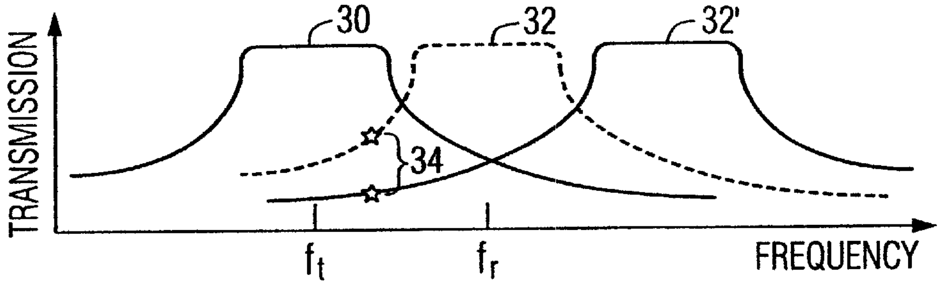
FIG. 2 is a graph of the frequency response of the filters of the duplexer of FIG. 1.

When designing a duplexer, in the transmit and receive frequency allocations are typically predetermined. Thus it would be difficult or impossible to offset them. It is possible, however, if the transmit and receive functions do not operate simultaneously. FIG. 2 is a graph of the frequency responses of the filters of the duplexer of FIG. 1. When operating in the transmit mode, the transmit channel filter passband 30 is centered on the assigned transmit frequency $f_t$, but the receive channel filter passband 32 is offset from the assigned receive frequency $f_r$, such that is occupies the passband 32'. When operating in the receive mode, the receive channel filter passband shifts back to passband 32 that is centered on the assigned receive frequency and the transmit channel filter is offset such that is occupies the passband 30' in FIG. 3.

Figure 3:
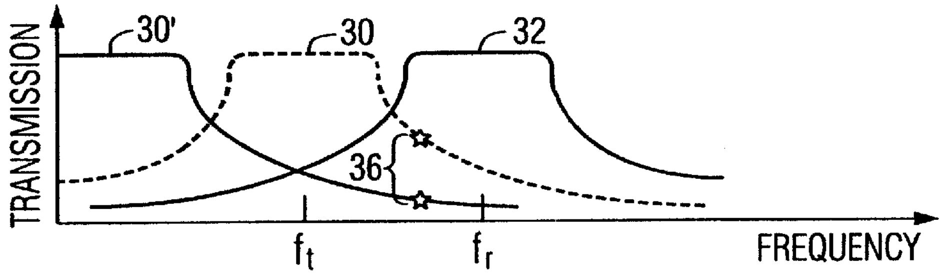
FIG. 3 is a graph of the frequency response of the filters of the duplexer of FIG. 1.

FIGS. 2 and 3 show the effect of the filter passband offset on the radio frequency signal isolation between transmit and receive operating modes. In FIG. 2, distance 34 illustrates the improvement in isolation achieved by shifting the passband of the receive filter. FIG. 3 shows the effect of offsetting the transmit channel filter when operating in the receive mode. Distance 36 illustrates the improvement in isolation achieved by shifting the passband of the transmit filter. Further separation of the transmit and receive frequencies will result in more isolation.

Figure 4:
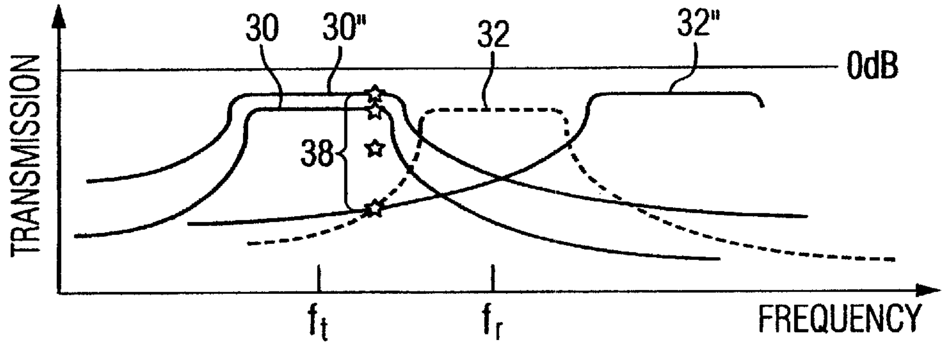
FIG. 4 is a graph of the frequency response of the filters of the duplexer of FIG. 1.

The frequency offsetting strategy can also be used to improve the channel filter insertion loss by permitting increased bandwidth of the transmit and/or receiver filters. An increase in filter bandwidth will reduce the isolation between the transmit and receive ports, but shifting the frequency will restore the isolation to approximately the original level. This is shown in FIG. 4 wherein the duplexer is shown in the transmit mode. The two curves 30 and 30" represent alternate transmit channel filter passbands. Curve 32 represents the receive channel's response before increasing bandwidth. Curve 32" represents the expanded bandwidth after being offset. It is seen that with the increased passband bandwidth illustrated by curve 32", the insertion loss improves markedly and the roll-off degrades. However, it is apparent that by increasing the bandwidth, both the insertion loss and the isolation are reduced.

Figure 5:
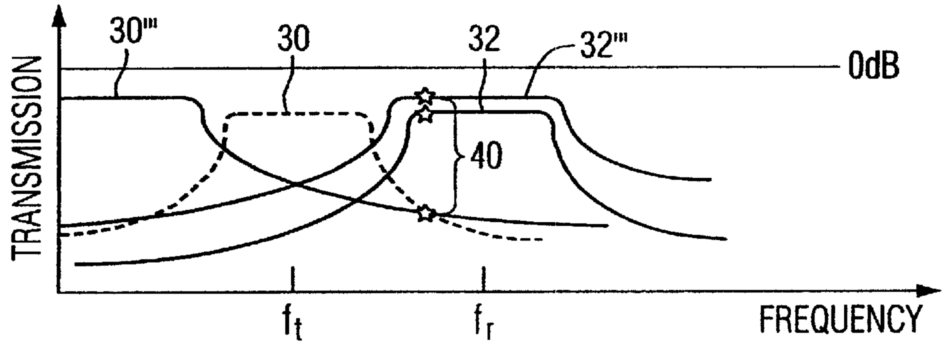
FIG. 5 is a graph of the frequency response of the filters of the duplexer of FIG. 1.

The vertical distance 38 represents the isolation when the filters have bandwidths illustrated by curves 30" and 32". The insertion loss improves as expected and the slope of the isolation is degraded, however the offset can restore the isolation to its original value at the transmit frequency. FIG. 5 represents the same process for the receive mode. In FIG. 5, curve 30 represents the original transmit filter passband and curve 30'" represents the shifted and expanded transmit filter passband. Curve 32 represents the original receive filter passband and curve 32'" represents the shifted and expanded receive filter passband. The vertical distance 40 represents the isolation when the filters have bandwidths illustrated by curves 30'" and 32'".

By adopting the method of this invention, the size of the duplexer can be reduced without affecting performance. When the filter size is reduced, it usually results in a lower resonator quality factor and higher insertion loss. However, the insertion loss can be restored by increasing the bandwidth and shifting the passband frequency as shown in FIGS. 4 and 5.

Figure 6:
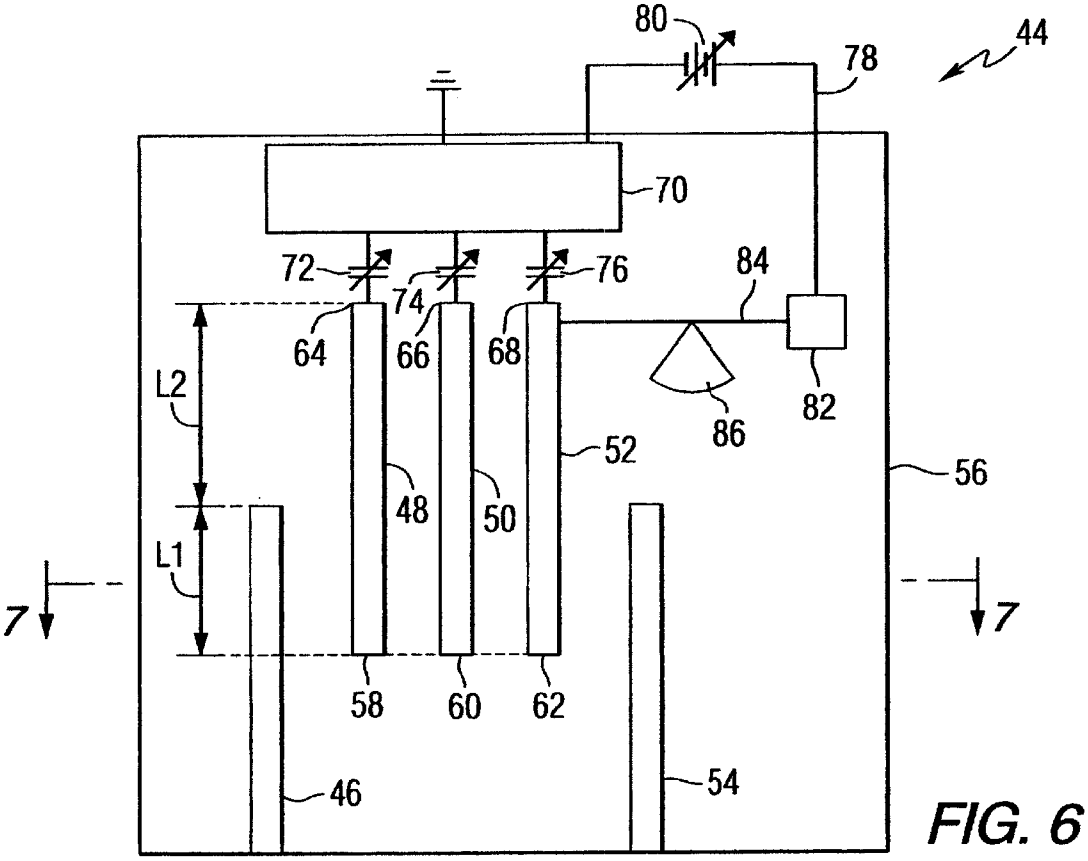
FIG. 6 is a schematic representation of a filter that can be used in the duplexer of FIG. 1.
Figure 7:
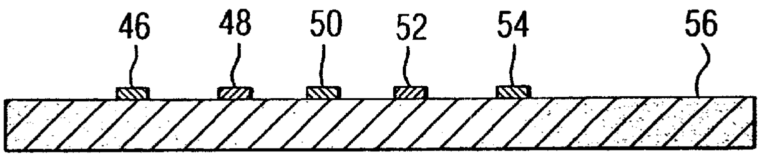
FIG. 7 is a cross-sectional view of the filter of FIG. 6 taken along line 7—7.

FIG. 6 is a plan view of a microstrip comb-line tunable 3-pole filter 44, tuned by dielectric varactors, that can be used in a tunable duplexer, and is more fully described in commonly owned U.S. patent application Ser. No. 09/704,850 (U.S. Pat. No. 6,525,630, filed Nov. 2, 2000 (PCT/US00/30269). FIG. 7 is a cross sectional view of the filter of FIG. 6, taken along line 7—7. Filter 44 includes a plurality of resonators in the form of microstip lines 48, 50, and 52 positioned on a planar surface of a substrate 56. The microstrip lines extend in directions parallel to each other. Lines 46 and 54 serve as an input and an output respectively. Line 46 includes a first portion that extends parallel to line 48 for a distance L1. Line 54 includes a first portion that extends parallel to line 52 for a distance L1. Lines 46, 48 and 50 are equal in length and are positioned side by side with respect to each other. First ends 58, 60 and 62 of lines 46, 48 and 50 are unconnected, that is, open circuited. Second ends 64, 66 and 68 of lines 46, 48 and 50 are connected to a ground conductor 70 through tunable dielectric varactors 72, 74 and 76. In the preferred embodiment, the varactors operate at room temperature. While a three-pole filter is described herein, filters having other numbers of poles can also be used. Additional poles can be added by adding more strip line resonators in parallel to those shown in FIG. 6.

A bias voltage circuit is connected to each of the varactors. However, for clarity, only one bias circuit 78 is shown in FIG. 6. The bias circuit includes a variable voltage source 80 connected between ground 70 and a connection tab 82. A high impedance line 84 connects tab 82 to line 52. The high impedance line is a very narrow strip line. Because of its narrow width, its impedance is higher than the impedances of the other strip lines in the filter. A stub 86 extends from the high impedance line. The bias voltage circuit serves as a low pass filter to avoid RF signal leak into the bias line.

The dielectric substrate 56 used in the filter is RT5880 ($\epsilon$=2.22) with a thickness of 0.508 mm (20 mils). Each of the three resonator lines 46, 48 and 50 includes one microstrip line serially connected to a varactor and ground. The other end of each microstrip line is an open-circuit. The open-end design simplifies the DC bias circuits for the varactors. In particular, no DC block is needed for the bias circuit. Each resonator line has a bias circuit. The bias circuit works as a low-pass filter, which includes a high impedance line, a radial stub, and termination patch to connect to a voltage source. The first and last resonator 48 and 52 are coupled to input and output line 46 and 54 of the filter, respectively, through the fringing fields coupling between them. Computer-optimized dimensions of microstrips of one example of the tunable filter are L1=1.70 mm, L2=1.61 mm, S1=0.26 mm, S2=5.84 mm, W1=1.52 mm, and W2=2.00 mm. In the preferred embodiment, the substrate is RT5880 with a 0.508 mm thickness and the strip lines are 0.5 mm thick copper. A low loss (<0.002) and low dielectric constant (<3) substrate is desired for this application. Of course, low loss substrates can reduce filter insertion loss, while low dielectric constants can reduce dimension tolerance at this high frequency range: The length of the strip lines combined with the varactors determine the filter center frequency. The lengths L1 or L2 strongly affect the filter bandwidth. While the strip line resonators can be different lengths, in practice, the same length is typically used to make the design simple.

The parallel orientation of the strip line resonators provides good coupling between them. However, input and output lines 46 and 54 can be bent in the sections that do not provide coupling to the strip line resonators.

The tunable filter of FIG. 6 has a microstrip comb-line structure. The resonators include microstrip lines, open-circuited at one end, with a dielectric varactor between the other end of each microstrip line and ground. Variation of the capacitance of the varactors is controlled by controlling the bias voltage applied to each varactor. This controls resonant frequency of the resonators and tunes the center frequency of filter. The input and output microstrip lines are not resonators but coupling structures of the filter. Coupling between resonators is achieved through the fringing fields between resonator lines. The simple microstrip comb-line filter structure with high Q dielectric varactors provides the advantages of low insertion loss, moderate tuning range, low intermodulation distortion, and low cost.

Tunable capacitors can be uses in the passband filters so that the duplexer can be tuned to different frequencies on demand. The filters can include resonators having resonant frequencies that can be controlled by an associated variable capacitor. When the variable capacitor's capacitance is electronically tuned, the resonator's frequency changes, which results in a shift in the filter's passband frequency. Electronically tunable filters have the important advantages of small size, low weight, low power consumption, simple control circuits, and fast tuning capability. The tunability provides an additional degree of freedom for duplexer designs to improve the insertion loss and the isolation simultaneously.

Figure 8:
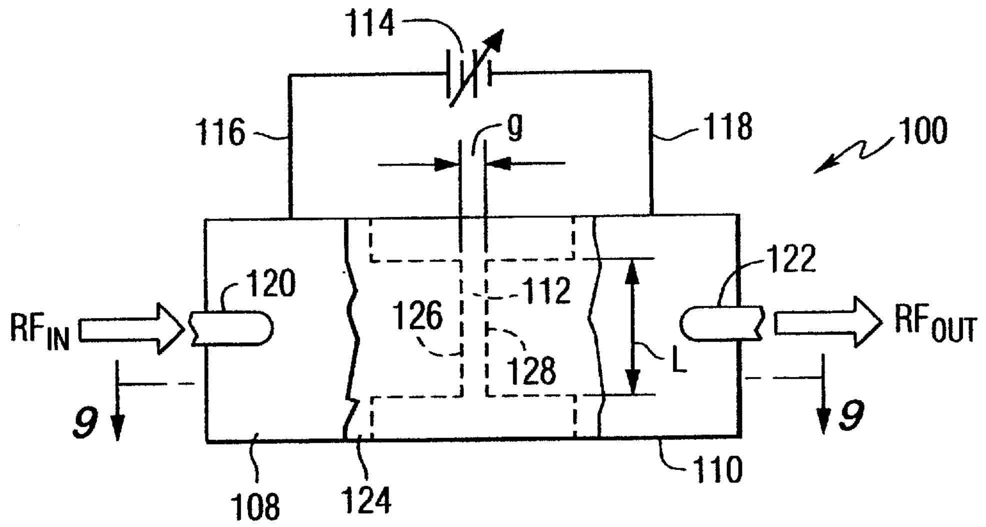
FIG. 8 is a top view of a tunable dielectric capacitor that can be used in the filter of FIG. 6.
Figure 9:
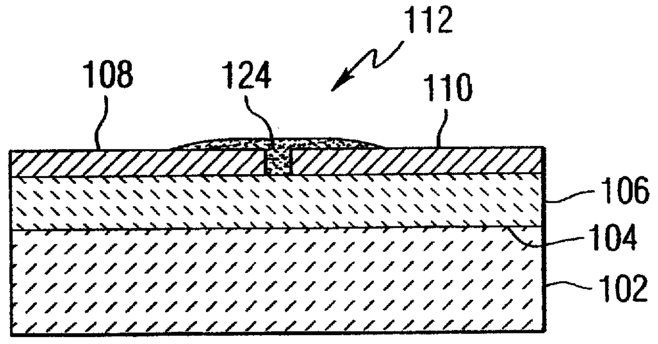
FIG. 9 is a cross-sectional view of the tunable dielectric capacitor of FIG. 8 taken along line 9—9.

FIGS. 8 and 9 are top and cross sectional views of a tunable dielectric varactor 100 that can be used in tunable bandpass filters. The varactor 100 includes a substrate 102 having a generally planar top surface 104. A tunable dielectric layer 106 is positioned adjacent to the top surface of the substrate. A pair of metal electrodes 108 and 110 are positioned on top of the ferroelectric layer. The substrate 102 is comprised of a material having a relatively low permittivity such as MgO, Alumina, $LaAlO_3$, Sapphire, or a ceramic. For the purposes of this description, a low permittivity is a permittivity of less than about 30. The tunable dielectric layer 106 is comprised of a material having a permittivity in a range from about 20 to about 2000, and having a tunability in the range from about 10% to about 80% at a bias voltage of about 10 V/$\mu$m. This layer is preferably comprised of Barium-Strontium Titanate, $Ba_xSr_{1-x}TiO_3$ (BSTO), where x can range from zero to one, or BSTO-composite ceramics. Examples of such BSTO composites include, but are not limited to: BSTO—MgO, BSTO—$MgAl_2O_4$, BSTO—$CaTiO_3$, BSTO—$MgTiO_3$, BSTO—$MgSrZrTiO_6$, and combinations thereof. The tunable layer in one example has a dielectric permittivity greater than 100 when subjected to typical DC bias voltages, for example, voltages ranging from about 5 volts to about 300 volts. A gap 112 of width g, is formed between the electrodes 108 and 110. The gap width must be optimized to increase ratio of the maximum capacitance $C_{max}$ to the minimum capacitance $C_{min}$ ($C_{max}/C_{min}$) and increase the quality facto (Q) of the device. The optimal width, g, will be determined by the width at which the device has maximum $C_{max}/C_{min}$ and minimal loss tangent.

A controllable voltage source 114 is connected by lines 116 and 118 to electrodes 108 and 110. This voltage source is used to supply a DC bias voltage to the tunable dielectric layer, thereby controlling the permittivity of the layer. The varactor also includes an RF input 120 and an RF output 122. The RF input and output are connected to electrodes 108 and 110, respectively, by soldered or bonded connections.

The varactors may use gap widths of less than 5–50 $\mu$m. The thickness of the tunable dielectric layer ranges from about 0.1 $\mu$m to about 20 $\mu$m. A sealant 124 can be positioned within the gap and can be any non-conducting material with a high dielectric breakdown strength to allow the application of high voltage without arcing across the gap. The sealant can be, for example, epoxy or polyurethane.

The other dimension that strongly influences the design of the varactors is the length, L, of the gap as shown in FIG. 8. The length of the gap L can be adjusted by changing the length of the ends 126 and 128 of the electrodes. Variations in the length have a strong effect on the capacitance of the varactor. The gap length will optimized for this parameter. Once the gap width has been selected, the capacitance becomes a linear function of the length L. For a desired capacitance, the length L can be determined experimentally, or through computer simulation.

The electrodes may be fabricated in any geometry or shape containing a gap of predetermined width. The required current for manipulation of the capacitance of the varactors disclosed in this invention is typically less than 1 $\mu$A. In the preferred embodiment, the electrode material is gold. However, other conductors such as copper, silver or aluminum, may also be used. Gold is resistant to corrosion and can be readily bonded to the RF input and output. Copper provides high conductivity, and would typically be coated with gold for bonding or nickel for soldering.

FIGS. 8 and 9 show a voltage tunable planar varactor having a planar electrode with a predetermined gap distance on a single layer tunable bulk, thick film or thin film dielectric. The applied voltage produces an electric field across the gap of the tunable dielectric that produces an overall change in the capacitance of the varactor. The width of the gap can range from 5 to 50 $\mu$m depending on the performance requirements.

Figure 10:
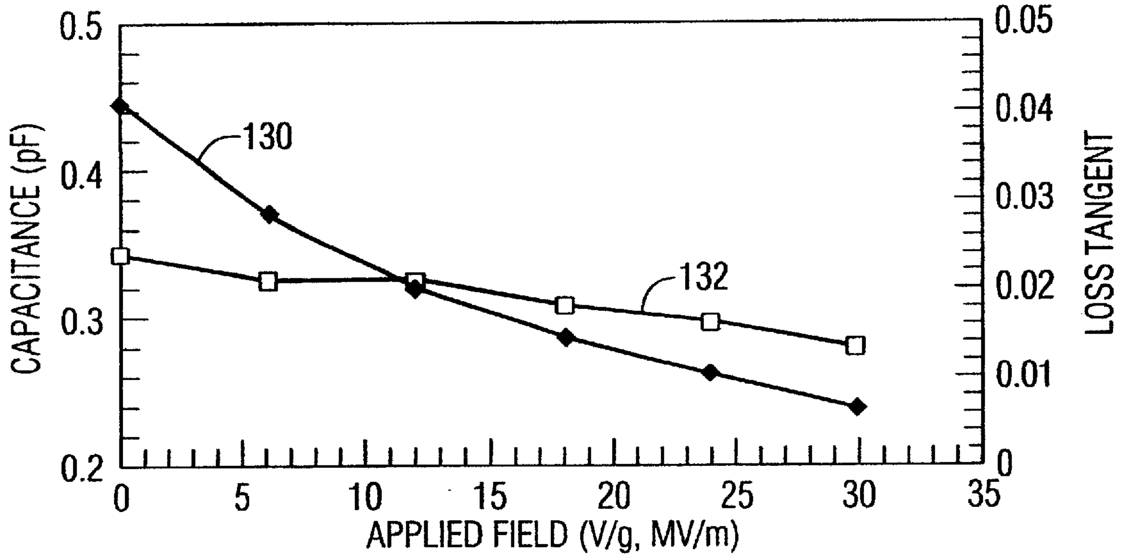
FIG. 10 is a graph of the capacitance of the varactor of FIGS. 8 and 9.

FIG. 10 shows an example of the capacitance 130 and the loss tangent 132 of a tunable dielectric varactor. By applying voltage to the varactor its capacitance value changes and consequently the frequency of the duplexer will be varied.

While a stripline filter has been described, other structures for the filter, such as iris coupled or inductive post coupled waveguide cavity filters, or filters based on dielectric resonator cavities, or other resonators such as lumped element LC circuits, or other planar structure resonators such as microstrip or coplanar resonators, etc. can be used in the duplexers of this invention. Variation of the capacitance of the tunable dielectric varactors in the tunable filters affects the resonant frequency of filter sections, and therefore affects the passband of the filters. The ability to rapidly tune the response using high-impedance control lines is inherent in electronically tunable radio frequency filters. Tunable dielectric materials technology enables these tuning properties, as well as, high Q values, low losses and extremely high IP3 characteristics, even at high frequencies.

Electronically tunable filters have low insertion loss, small size, high isolation, fast tuning speed, high power-handling capability, high IP3 and low cost in the microwave frequency range. Compared to the voltage-controlled semiconductor diode varactors, voltage-controlled tunable dielectric capacitors have higher Q factors, higher power-handling and higher IP3. Voltage-controlled tunable dielectric capacitors have a capacitance that varies approximately linearly with applied voltage and can achieve a wider range of capacitance values than is possible with semiconductor diode varactors. The tunable dielectric varactor based tunable duplexers of this invention have the merits of lower loss, higher power-handling, and higher IP3, especially at higher frequencies (>10 GHz).

The tunable dielectric varactors can include a low loss $(Ba,Sr)TiO_3$-based composite film. The typical Q factor of the tunable dielectric capacitors is 200 to 500 at 2 GHz, and 50 to 100 at 20 to 30 GHz, with a capacitance ratio ($C_{max}/C_{min}$), which is independent of frequency, of around 2. A wide range of capacitance of the tunable dielectric capacitors is variable, say 0.1 pF to 10 pF. The tuning speed of the tunable dielectric capacitor is less than 30 ns. The practical tuning speed is determined by auxiliary bias circuits.

Tunable dielectric materials have been described in several patents. Barium strontium titanate ($BaTiO_3$—$SrTiO_3$), also referred to as BSTO, is used for its high dielectric constant (200–6,000) and large change in dielectric constant with applied voltage (25–75 percent with a field of 2 Volts/micron). Tunable dielectric materials including barium strontium titanate are disclosed in U.S. Pat. No. 5,427,988 by Sengupta, et al. entitled "Ceramic Ferroelectric Composite Material-BSTO—MgO"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO—ZnO"; U.S. Pat. No. 6,074,971 by Chiu et al. entitled "Ceramic Ferroelectric Composite Materials with Enhanced Electronic Properties BSTO—Mg Based Compound-Rare Earth Oxide". These patents are incorporated herein by reference.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)_5KH_2PO_4$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. Patent Applications, assigned to the assignee of this application, disclose additional examples of tunable dielectric materials: U.S. application Ser. No. 09/594,837 filed Jun. 15, 2000 (U.S. Pat. No. 6,514,895), entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. Provisional Application Serial No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Thick films of tunable dielectric composites can comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components or two or more of these components in quantities from 0.25 weight percent to 80 weight percent with BSTO weight ratios of 99.75 weight percent to 20 weight percent.

The electronically tunable materials can also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase. Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include $Mg_2SiO_4$, MgO, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, PbO, $Bi_2O_3$ and $La_2O_3$. Particularly preferred additional metal oxides include $Mg_2SiO_4$, MgO, $CaTiO_3$, $MgZrSrTiO_6$, $MgTiO_3$, $MgAl_2O_4$, $MgTa_2O_6$ and $MgZrO_3$.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases may include at least two Mg-containing compounds. In addition to the multiple Mg-containing compounds, the material may optionally include Mg-free compounds, for example, oxides of metals selected from Si, Ca, Zr, Ti, Al and/or rare earths. In another embodiment, the additional metal oxide phases may include a single Mg-containing compound and at least one Mg-free compound, for example, oxides of metals selected from Si, Ca, Zr, Ti, Al and/or rare earths. The high Q tunable dielectric capacitor utilizes low loss tunable substrates or films.

To construct a tunable device, the tunable dielectric material can be deposited onto a low loss substrate. In some instances, such as where thin film devices are used, a buffer layer of tunable material, having the same composition as a main tunable layer, or having a different composition can be inserted between the substrate and the main tunable layer. The low loss dielectric substrate can include magnesium oxide (MgO), aluminum oxide ($Al_2O_3$), and lanthium oxide ($LaAl_2O_3$).

This invention is particularly suited for electronically tunable radio frequency duplexers. Compared to mechanically and magnetically tunable duplexers, electronically tunable duplexers have the most important advantage of fast tuning capability over wide band application. Because of this advantage, they can be used in the applications such as LMDS (local multipoint distribution service), PCS (personal communication system), frequency hopping, satellite communication, and radar systems. A single duplexer can enable radio manufacturers to replace several fixed duplexers covering adjacent frequencies. This versatility provides front end RF tunability in real time applications and decreases deployment and maintenance costs through software controls and reduced component count. Also, fixed duplexers need to be wide band so that their count does not exceed reasonable numbers to cover the desired frequency plan. Tunable duplexers, however, are narrow band, but they can cover even larger frequency band than fixed duplexers by tuning the filters over a wide range. Additionally, narrowband filters at the front end are appreciated from the systems point of view, because they provide better selectivity and help reduce interference from nearby transmitters. Narrowband electronically tunable radio frequency duplexers can also be used for tunable channel selectivity.

The filters used in a duplexer that can be operated in accordance with the invention can use a waveguide structure, which is tuned by voltage-controlled tunable dielectric capacitors placed inside the waveguide. In the filter structure, the tuning element is a voltage-controlled tunable capacitor, which is made from tunable dielectric material. Since the tunable capacitors show high Q, high IP3 (low inter-modulation distortion) and low cost, the tunable duplexer in the present invention has the advantage of low insertion loss, fast tuning speed, and high power handling. The present tunable dielectric material technology makes electronically tunable duplexers very promising in the contemporary communication system applications.

Compared to voltage-controlled semiconductor diode varactors, voltage-controlled tunable dielectric capacitors have higher Q factors, higher power-handling and higher IP3. Voltage-controlled tunable dielectric capacitors are employed in the duplexer structure to achieve the goal of this object. Also, tunable duplexers based on MEM technology can be used for these applications. Compared to semiconductor varactor based tunable duplexers, dielectric varactor based tunable duplexers have the merits of lower loss, higher power-handling, and higher IP3, especially at higher frequencies (>10 GHz). MEM based varactors can also be used for this purpose. They use different bias voltages to vary the electrostatic force between two parallel plates of the varactor and hence change its capacitance value. They show lower Q than dielectric varactors, but can be used successfully for low frequency applications.

At least two microelectromachanical variable capacitor topologies can be used, parallel plate and interdigital. In parallel plate structure, one of the plates is suspended at a distance from the other plate by suspension springs. This distance can vary in response to electrostatic force between two parallel plates induced by applied bias voltage. In the interdigital configuration, the effective area of the capacitor is varied by moving the fingers comprising the capacitor in and out and changing its capacitance value. MEM varactors have lower Q than their dielectric counterpart, especially at higher frequencies, but can be used in low frequency applications.

This invention relates to tunable duplexers that would could be used to replace fixed duplexers in receivers. A single tunable duplexer solution would enable radio manufacturers to replace several fixed duplexers covering adjacent frequencies. This versatility can provide front end RF tunability in real time applications and decrease deployment and maintenance costs through software controls and reduced component count.

The duplexer offset technique of this invention is useful in all kinds of wireless communications, but especially in mobile and portable applications. Accordingly, by utilizing filters having high Q tunable capacitors, the present invention provides improved transmitter and receiver isolation.

While the present invention has been described in relation to a duplexer in transceiver having a transmit and receive section, it is not so limited. For example, the technique can be applied to two transmitter channels or to two receiver channels, or to multiplexer applications. Thus, it will be apparent to those skilled in the art that various changes can be made to the disclosed embodiments without departing from the scope of the invention as set forth in the following claims.

What is claimed is:

1. A duplexer, comprising:

a first tunable bandpass filter;

a second tunable bandpass filter; and means for coupling the first bandpass filter and the second bandpass filter to an antenna, wherein said duplexer is operated by:

tuning the first tunable bandpass filter to provide a passband corresponding to an assigned transmit frequency, and tuning the second tunable bandpass filter to provide a passband offset from an assigned receive frequency, when said duplexer is operated in a transmit mode; and tuning the first tunable bandpass filter to provide a passband offset from an assigned transmit frequency, and tuning the second tunable bandpass filter to provide a passband corresponding to the assigned receive frequency, when said duplexer is operated in a receive mode.

2. The duplexer according to claim 1, wherein the passbands and the passband offsets are set by controlling tunable capacitors in each of the first and second tunable bandpass filters.

3. The duplexer according to claim 2, wherein said tunable capacitors each comprise a tunable dielectric varactor.

4. The duplexer according to claim 2, wherein said tunable capacitors each comprise a microelectromechanical variable capacitor.

5. The duplexer according to claim 1, wherein said means for coupling the first bandpass filter and the second bandpass filter to an antenna comprises one of a circulator, a T-junction, and an orthomode transducer.

6. The duplexer according to claim 3, wherein each tunable capacitor comprises:

a substrate having a first dielectric constant and having generally a planar surface;

a tunable dielectric layer positioned on the generally planar surface of the substrate, the tunable dielectric layer having a second dielectric constant greater than said first dielectric constant; and first and second electrodes positioned on a surface of the tunable dielectric layer opposite the generally planar surface of the substrate, said first and second electrodes being separated to form a gap therebetween.

7. The duplexer according to claim 6, wherein each tunable capacitor further comprises an insulating material in said gap.

8. The duplexer according to claim 1, wherein each of the first bandpass filter and the second bandpass filter comprises:

a substrate;

a ground conductor;

an input;

an output;

a first microstrip line positioned on the substrate, and electrically coupled to the input and the output; and a first tunable dielectric varactor electrically connected between the first microstrip line and the ground conductor.

9. The duplexer according to claim 8, wherein said input comprises a second microstrip line positioned on the substrate and having a first portion lying parallel to the first microstrip line; and said output comprises a third microstrip line positioned on the substrate and having a first portion lying parallel to the first microstrip line.

10. The duplexer according to claim 8, wherein said first microstrip line includes a first end and a second end, the first end of said first microstrip line being open circuited and said varactor being connected between the second end of said first microstrip line and the ground conductor.

11. The duplexer according to claim 1, wherein each of the first bandpass filter and the second bandpass filter comprises one of a waveguide cavity filter, a dielectric resonator cavity filter, a lumped element filter, and a planar structure resonator filter.

* * * * *